United States Patent [19]

Ienaka

[11] 4,166,925
[45] Sep. 4, 1979

[54] FM STEREO DEMODULATOR

[75] Inventor: Masanori Ienaka, Kodaira, Japan

[73] Assignee: Hitachi, Ltd., Ohtemachi, Japan

[21] Appl. No.: 892,672

[22] Filed: Apr. 3, 1978

[30] Foreign Application Priority Data

May 20, 1977 [JP] Japan .................................. 52/57707

[51] Int. Cl.² .......................... H04H 5/00; H04B 1/10
[52] U.S. Cl. ............................ 179/1 GM; 325/492; 325/483
[58] Field of Search ............ 179/1 GM, 1 GE, 1 GD; 325/478, 480, 492, 36, 483

[56] References Cited

U.S. PATENT DOCUMENTS 3,916,321 10/1975 Morse .................................... 325/480
4,091,241 5/1978 Sakaida ............................. 179/1 GM Primary Examiner—Kathleen H. Claffy
Assistant Examiner—Kenneth A. Chayt
Attorney, Agent, or Firm—Craig and Antonelli

[57] ABSTRACT

In an FM stereo demodulator, a detector circuit for detecting a low supply voltage is used. The detection level of this detector circuit is made substantially equal to a supply voltage value at the time when the oscillation frequency of an oscillator circuit for reproducing a subcarrier signal begins to change. The stereo reproduction of the demodulator is compulsorily switched to monaural reproduction by an output from the detector circuit. As a result, the generation of an abnormal sound which is attributed to the beat between the reproduced subcarrier signal having fluctuated and a subcarrier signal component of a received broadcast signal is prevented.

5 Claims, 3 Drawing Figures

FM STEREO DEMODULATOR

BACKGROUND OF THE INVENTION

This invention is related to an FM stereo demodulator, and move particularly to an abnormal sound-preventing circuit in an FM stereo demodulator.

In an FM stereo demodulator circuit employing a PLL (phase locked loop), a voltage-controlled oscillator circuit (hereinbelow abbreviated to "VCO") constituting the PLL circuit receives an output signal of a phase detector in the PLL as a control signal and delivers an oscillation signal whose frequency and phase are controlled with regard to a pilot signal included in an FM detection signal. A reproduced subcarrier signal of 38 KHz for FM stereo demodulation is obtained on the basis of the oscillation signal.

The self oscillation frequency of the VCO, however, is ordinarily affected by a supply voltage and fluctuates according to a variation in the supply voltage even when the level of the control signal is constant.

Essentially, such fluctuation of the oscillation frequency is corrected by the output of the phase detector in the PLL. The correction, however, becomes impossible when the supply voltage drops drastically, causing the oscillation frequency to approach or exceed the boundary value between the lock range and the capture range of the PLL. When the frequency of the VCO has fluctuated in this manner, the frequency and phase of the reproduced subcarrier signal fluctuate accordingly, and a beat signal develops between the reproduced subcarrier signal and a subcarrier signal component in a composite signal of broadcast reception. As a result, an abnormal sound (noise) due to the beat signal comes to be included in each reproduced stereo output signal, i.e., right and left signals which are obtained by, for example, switching the composite signal with the reproduced subcarrier signal.

Such an abnormal sound results in a case where the supply voltage has conspicuously dropped on account of, for example, a high voice output, or in a case where a battery whose electromotive force has dropped is used in a receiver such as a portable radio set which operates at a low voltage. Even in a receiver which operates at a comparatively high voltage, in case where the supply voltage varies slowly when turning a power switch "on" or "off", the noise results in the course of the rise or fall of the supply voltage.

SUMMARY OF THE INVENTION

It is accordingly an object of this invention to provide a circuit which prevents the abnormal sound from developing during low voltage operation as described above in an FM stereo receiving set.

In this invention, a low supply voltage of a value less than a low supply voltage value at which the oscillation frequency of an oscillator circuit for obtaining a reproduced subcarrier signal begins to fluctuate is detected by a detector circuit so as to compulsorily switch stereo reproduction to monaural reproduction by the detection output of the detector circuit.

Hereunder, this invention will be concretely described in conjunction with the preferred embodiments by referring to the drawings.

PREFERRED EMBODIMENTS OF THE INVENTION

Figure 1:
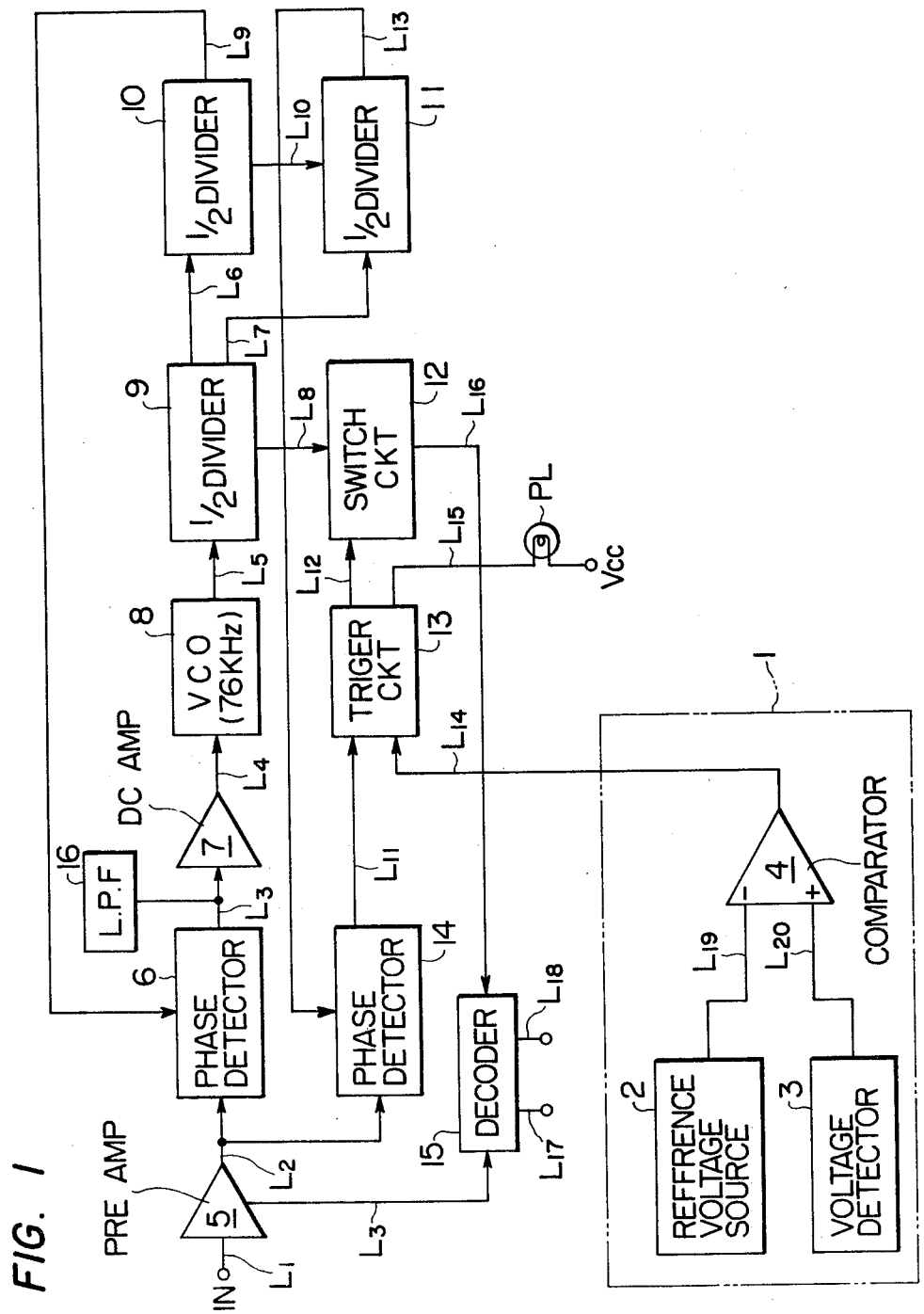
FIG. 1 is a block diagram showing an embodiment of this invention.

FIG. 1 is a block diagram of a circuit of an embodiment of this invention.

Referring to the figure, numeral 5 designates a pre-amplifier. The pre-amplifier 5 receives at an input terminal IN an FM detection signal, that is, a stereo composite signal which includes a sum signal of right and left signals, a difference signal modulated by a 38 KHz-subcarrier, and a 19 KHz-pilot signal. It delivers the amplified composite signal to lines L2 and L3.

Numeral 6 designates a phase detector, which receives the composite signal from the pre-amplifier 5 and a 19 KHz-signal from a frequency demultiplier circuit 10 to be described later and which provides a d.c. output corresponding to the phase difference between the pilot signal in the composite signal and the divided frequency output from the frequency demultiplier circuit 10.

Shown at 7 is a d.c. amplifier, which amplifies the output signal of the phase detector 6.

Numeral 8 denotes a VCO (voltage-controlled oscillator), which receives the output signal of the d.c. amplifier 7 as a control signal and which delivers an oscillation signal of 76 KHz.

Blocks 9 to 11 are frequency demultiplier circuits, respectively. The frequency demultiplier circuit 9 receives the output of the VCO 8, and delivers signals of a frequency divided by 2. The frequency demultiplier circuits 10 and 11 receive the divided frequency outputs of the frequency demultiplier circuit 9 opposite in phase to each other, and deliver signals of a frequency divided by 2, respectively.

Numeral 14 designates a phase detector, which receives the composite signal from the pre-amplifier 5 and the 19 KHz-signal from the frequency demultiplier circuit 11 and which provides a d.c. output corresponding to the level of the pilot signal in the composite signal.

Numeral 13 designates a trigger circuit, which receives the output of the phase detector 14 and an output of a detection unit 1 to be described later and which controls a stereo switching circuit 12 and a stereo indicating lamp PL.

The stereo switching circuit 12 transmits the reproduced subcarrier signal from the fuequency demultiplier circuit 9 to a decoder circuit 15 on the basis of an output of the trigger circuit 13.

The stereo indicating lamp PL ignites during stereo reproduction.

The decoder circuit 15 receives the composite signal from the pre-amplifier 5 and the reproduced subcarrier signal transferred from the stereo switching circuit 12, and delivers reproduced stereo signals.

A low-pass filter 16 gives the succeeding stage only the low region of the comparative output generated by the phase comparator 6.

The circuits 6 to 10 and 16 constitute a PLL (phase locked loop).

The circuit arrangement of each of the circuits 5 to 12, 14 and 15 is not a special one, but may be a known one. For example, it may be similar to a circuit employing "FM Stereo Demodulator IC HA1156" (trade name, product of Hitachi Ltd.).

In the circuit illustrated by the block diagram, the output frequency of the frequency demultiplier circuit 11 fluctuates in response to the fluctuation of the oscillation frequency of the VCO 8.

In a case where such a fluctuation arises in the output of the frequency demultiplier circuit 11, the phase detector circuit 14 fails to detect the pilot signal in the composite signal, and hence, it may provide at its output terminal an output level which corresponds to the monaural reception state. In such a case, the stereo switching circuit 12 is opened through the trigger circuit 13. That is, the decoder circuit 15 attains the monaural reproduction state. With only the phase detector 14, however, the stereo switching circuit 12 is opened after the reproduced subcarrier signal from the frequency demultiplier circuit 9 has fluctuated, so that the undesirable reproduced subcarrier signal is supplied to the decoder circuit 15 within the delay time of the operation.

In this embodiment, the detection unit 1 is disposed in order to prevent an abnormal sound from arising in the reproduced stereo output at the time of a low supply voltage. The trigger circuit 13 is controlled by the output of this detection unit.

The detection unit 1 is constructed of a circuit 2 for generating a reference voltage, a circuit 3 for generating a voltage which follows up a fluctuation in the supply voltage of the VCO 8, and a voltage comparator circuit 4 for comparing both the voltages.

The abnormal sound as stated above is not audible in the state in which the amount of fluctuation of the oscillation frequency of the VCO 8 is comparatively small. It is desirable that the decoder circuit 15 carry out the stereo reproduction as far as possible during the stereo broadcast reception. The detecting level of the detection unit 1 is accordingly determined within a reasonable range with reference to that supply voltage of the VCO 8 which induces the fluctuation in the VCO oscillation output.

The output reference voltage of the reference voltage generator 2 is set so as to be substantially equal to the output voltage of the voltage generator circuit 3 at the time when the fluctuation is induced in the VCO oscillation output.

The voltage comparator circuit 4 compares the output voltages of the circuits 2 and 3, and renders the signal at its output terminal a low level when the output voltage of the circuit 3 has become lower than the reference output voltage of the circuit 2.

When the output signal of the detection unit 1, i.e., that of the voltage comparator circuit 4 is at the low level, the trigger circuit 13 opens the stereo switching circuit 12 irrespective of the output signal level of the phase detector 14.

According to the above construction, immediately before the supply voltage drops and the frequency of the reproduced subcarrier signal fluctuates, or during the period in which the supply voltage is still low after closure of a power switch, the stereo switching circuit 12 is opened and stereo reproduction is compulsorily turned into monaural reproduction.

In this manner, the undesirable reproduced subcarrier signal whose frequency and phase fluctuate due to the low supply voltage is not fed to the decoder circuit 15, and only the normal reproduced subcarrier signal is fed thereto. As a result, generation of the abnormal sound is prevented.

Figure 2:
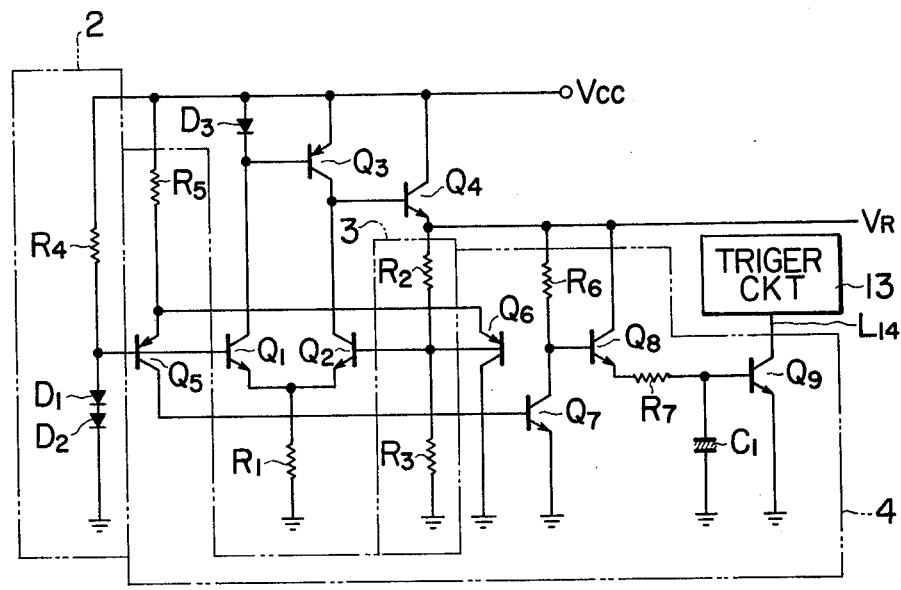
FIG. 2 is a circuit diagram showing an embodiment of this invention.

FIG. 2 is a circuit diagram of a concrete embodiment of the detection unit 1 in the state in which it is combined with a constant-voltage circuit.

Referring to the figure, the constant-voltage circuit is made up of differential transistors $Q_1$ and $Q_2$ as well as an emitter resistor $R_1$, a diode $D_3$ which is disposed on the collector side of the transistor $Q_1$, a p-n-p transistor $Q_3$ which is disposed on the collector side of the transistor $Q_2$, a transistor $Q_4$ which is controlled by the transistor $Q_3$, series resistors $R_2$ and $R_3$ which divide a constant voltage of the emitter output of the transistor $Q_4$, and diodes $D_1$ and $D_2$ and a resistor $R_4$ which constitute a reference voltage circuit disposed in correspondence with the divided voltage output.

The differential transistors $Q_1$ and $Q_2$ control the base potential of the transistor $Q_4$ so that the difference between the reference voltage composed of forward voltages developing in the diodes $D_1$ and $D_2$ and the divided voltage owing to the resistors $R_2$ and $R_3$ may become zero. In consequence, the constant voltage $V_R$ which depends on the forward voltages of the diodes $D_1$ and $D_2$ and the voltage dividing ratio of the resistors $R_2$ and $R_3$ is obtained at the emitter of the transistor $Q_4$.

The voltage $V_R$ is used as the supply voltage for the VCO 8 constructed of a CR oscillator circuit.

In this embodiment, the divided voltage output circuit which consists of the resistors $R_2$ and $R_3$ is also used as the voltage generator circuit 3, while the constant-voltage circuit which consists of the diodes $D_1$ and $D_2$ and the resistor $R_4$ is also used as the reference voltage circuit 2. The voltage comparator circuit 4 is made up of p-n-p transistors $Q_5$ and $Q_6$, an emitter resistor $R_5$ which is connected to the common emitter of the transistors $Q_5$ and $Q_6$, transistors $Q_7$ to $Q_9$, resistors $R_6$ and $R_7$, and a capacitor $C_1$.

The base potential of the transistor $Q_5$ is substantially equal to that of the transistor $Q_6$ when the supply voltage $V_{CC}$ is sufficiently high and the constant-voltage circuit is therefore operating normally. Accordingly, substantially equal collector currents flow through the transistors $Q_5$ and $Q_6$. Owing to the collector current of the transistor $Q_5$, the transistor $Q_7$ attains the conductive state, and the transistors $Q_8$ and $Q_9$ attain the nonconductive state.

On account of the nonconductive state of the transistor $Q_9$, the trigger circuit 13 is controlled solely by the output of the phase detector 14.

When the supply voltage $V_{CC}$ becomes low and it becomes impossible to apply sufficient bias voltages to the transistors $Q_3$ and $Q_4$, the output voltage $V_R$ of the voltage regulator circuit fails to become the constant voltage. In this case, the output voltage $V_R$ fluctuates according to the fluctuation of the supply voltage $V_{CC}$.

Due to the lowering of the output voltage $V_R$, the voltage divided by the resistors $R_2$ and $R_3$ becomes lower than the forward voltages in the diodes $D_1$ and $D_2$. As a result, the transistor $Q_6$ attains the conductive state, and the transistor $Q_5$ attains the nonconductive state.

The nonconductive state of the transistor $Q_5$ leads to the conductive state of the transistor $Q_9$. Owing to the conductive state of the transistor $Q_9$, the trigger circuit 13 opens the stereo switching circuit 12 and extinguishes the stereo indicating lamp PL irrespective of the output of the phase detector 14.

Figure 3:
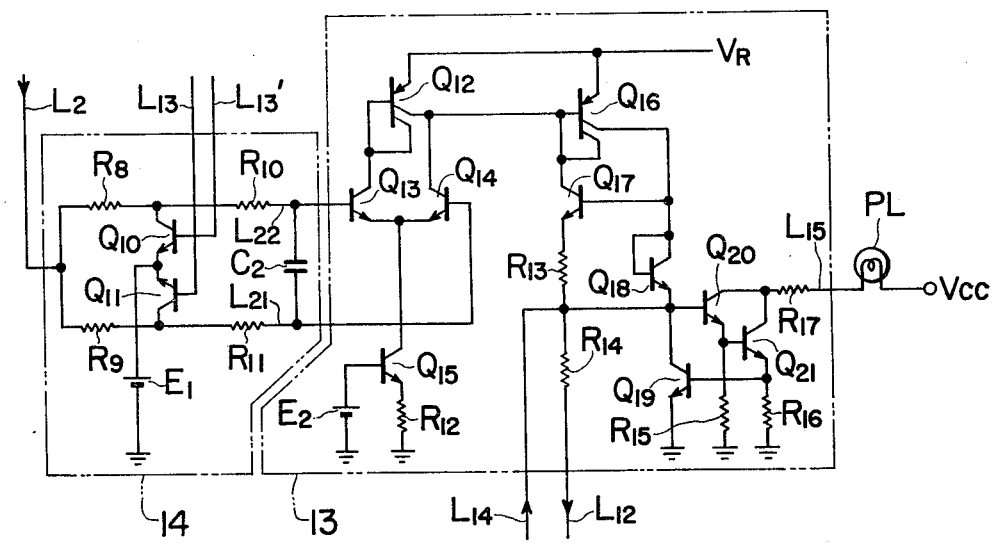
FIG. 3 is a circuit diagram of circuit blocks 13 and 14 in FIG. 1.

FIG. 3 is a circuit diagram of the phase detector 14 and the trigger circuit 13.

The phase detector 14 is composed of transistors $Q_{10}$ and $Q_{11}$, resistors $R_8$ to $R_{11}$, and a capacitor $C_{11}$. The composite signal from the pre-amplifier 5 is impressed on the input line L2 of the phase detector 14, and the output signals from the frequency demultiplier circuit 11 as have phases opposite to each other are impressed on input lines L13 and L13' thereof. The transistors $Q_{10}$ and $Q_{11}$ execute switching operations in phases opposite to each other by the input signals entering the bases thereof. Under the state in which the PLL is locked, the signal on the line L13 has the same phase as that of the pilot signal in the composite signal on the line L2. During the stereo broadcast reception, a line L21 becomes a positive potential with respect to a line L22. During the monaural reception, the potentials of the lines L21 and L22 become equal. A power source $E_1$ is a bias voltage source.

The trigger circuit 13 is composed of transistors $Q_{12}$ to $Q_{21}$, and resistors $R_{12}$ to $R_{17}$. During the stereo broadcast reception, the collector current of the differential transistor $Q_{14}$ is greater than that of the differential transistor $Q_{13}$ owing to the potential difference between the lines L21 and L22, so that the transistor $Q_{16}$ is in the conductive state. If, at this time, the transistor $Q_9$ in FIG. 2 is nonconductive, the potential of a line L14 is at a high level owing to the conductive state of the transistor $Q_{16}$. The high potential level of the line L14 brings the transistors $Q_{20}$ and $Q_{21}$ into the conductive state and consequently ignites the lamp PL. Simultaneously, the stereo switching circuit 12 is closed through the resistor $R_{14}$ and a line L12. In contrast, if the transistor $Q_9$ is conductive, the potential of the line L14 attains a low level, with the result that the transistors $Q_{20}$ and $Q_{21}$ attain the nonconductive state and the stereo switching circuit 12 opens.

The transistor $Q_{13}$ is set so as to cause to flow a collector current greater than that of the transistor $Q_{14}$ during the monaural broadcast reception, so that the transistor $Q_{16}$ is in the nonconductive state. Under this state, the potential of the line L14 is at the low level.

As apparent from the above embodiment, the circuit 3 for generating the voltage which varies following up the supply voltage need not vary following up the supply voltage at all times, but it may vary following up the supply voltage at least while the supply voltage is below the value immediately before the generation of the abnormal sound.

Since the circuit of the embodiment uses the constant-voltage circuit and the voltage divider circuit also as the reference voltage circuit and the voltage generator circuit which constitute the abnormal sound-preventing circuit, respectively, a conspicuous increase in the number of circuit elements is avoidable as a whole.

This invention is not restricted to the foregoing embodiments, but is subject to various alterations and modifications. In order to change-over the stereo reproduction to the monaural reproduction, the invention can adopt all the available expedients capable of stereo/monaural switching, such as stopping the oscillation of the VCO on the basis of the voltage comparison output and inhibiting the entrance of the pilot signal of the PLL on the basis of the same.

The voltage comparison output which serves to changeover the stereo reproduction to the monaural reproduction as described above may be also used for controlling, e.g., an indicating lamp indicative of the replacement of battery means in a battery-operated receiving set.

The detection unit of this invention is also applicable to a receiving set equipped with a PLL, in order to control a switching circuit for ceasing the receiving operation when the reception frequency fluctuates due to the lowering of supply voltage.

I claim:

1. An FM stereo demodulator comprising a detection unit which detects a power supply voltage deficiency of sufficient absolute value to induce a fluctuation in the oscillation frequency of an oscillator circuit, and a control circuit which compulsorily switches stereo reproduction to monaural reproduction on the basis of an output of said detection unit.

2. An FM stereo demodulator according to claim 1, wherein said detection unit consists of a source voltage generator circuit which generates a voltage at least somewhat related to the power supply voltage, a reference voltage generator circuit which delivers a reference voltage previously set, and a comparator circuit which receives the output of said voltage generator circuit and the output of said reference voltage generator circuit.

3. An FM stereo demodulator according to claim 2, wherein said source voltage generator circuit is constructed as a constant-voltage circuit which feeds said oscillator circuit with a constant supply voltage.

4. An FM stereo demodulator according to claim 1, wherein said oscillator circuit is a voltage-controlled oscillator circuit in a phase locked loop.

5. An FM stereo demodulator according to claim 4, wherein said control circuit is constructed of a gate circuit which inhibits a reproduced subcarrier signal from entering an FM stereo demodulation circuit.

* * * * *